United States Patent [19]
Nakagawa et al.

[11] Patent Number: 5,826,036
[45] Date of Patent: Oct. 20, 1998

[54] INFORMATION PROCESSING APPARATUS

[75] Inventors: Kanji Nakagawa; Norihiro Kumagai, both of Kyoto, Japan

[73] Assignee: Sharp Kabushiki Kaisha, Osaka, Japan

[21] Appl. No.: 861,760

[22] Filed: May 22, 1997

[30] Foreign Application Priority Data

May 23, 1996 [JP] Japan .................................. 8-128518

[51] Int. Cl.⁶ .................................................. H03M 7/00
[52] U.S. Cl. ...................................................... 395/200.77
[58] Field of Search ...................... 364/715.02; 382/232, 382/243, 244; 395/200.77, 888; 707/101

[56] References Cited

U.S. PATENT DOCUMENTS 5,006,849 4/1991 Baarman et al. ......................... 341/95
5,499,293 3/1996 Behram et al. .......................... 380/4
5,546,575 8/1996 Potter et al. ........................... 707/101

FOREIGN PATENT DOCUMENTS 5-189196 7/1993 Japan .

*Primary Examiner*—William M. Treat
*Attorney, Agent, or Firm*—Birch, Stewart, Kolasch & Birch, LLP

[57] ABSTRACT

An information processing apparatus including a first input section for receiving a first string including a plurality of words and a border-indicating character indicating a border between two adjacent words in the first string; a first extraction section for extracting the plurality of words from the first string, based on the border-indicating character; a first conversion section for converting a leading character of each of the plurality of words into a different type of character; and a first output section for outputting a second string including the plurality of words with the converted leading characters substituted for the respective leading characters.

13 Claims, 5 Drawing Sheets

If you wish more details of PC-A4, please feel free to call me. (62 characters)

@IfYouWishMoreDetailsOf^PC-A4^,PleaseFeelFreeToCallMe.   (54 characters)

| | ① | ② | ③ | ④ | ⑤ | ⑥ | ⑦ | ⑧ | ⑨ | ⑩ | ⑪ | ⑫ | ⑬ | ⑭ | ⑮ | ⑯ | ⑰ | ⑱ |
|---|---|---|---|---|---|---|---|---|---|---|---|---|---|---|---|---|---|---|
| Character | @ | T | h | e | □ | t | i | m | e | □ | h | a | s | □ | c | o | m | e |
| Code | 40 | 54 | 68 | 65 | 20 | 74 | 69 | 6d | 65 | 20 | 68 | 61 | 73 | 20 | 63 | 6f | 6d | 65 |

(18 characters)

| | ① | ② | ③ | ④ | ⑤ | ⑥ | ⑦ | ⑧ | ⑨ | ⑩ | ⑪ | ⑫ | ⑬ | ⑭ | ⑮ |
|---|---|---|---|---|---|---|---|---|---|---|---|---|---|---|---|
| Character | @ | T | h | e | T | i | m | e | H | a | s | C | o | m | e |
| Code | 40 | 54 | 68 | 65 | 54 | 49 | 6d | 65 | 48 | 61 | 73 | 43 | 6f | 6d | 65 |

(15 characters)

| | ① | ② | ③ | ④ | ⑤ | ⑥ | ⑦ | ⑧ | ⑨ | ⑩ | ⑪ | ⑫ | ⑬ | ⑭ | ⑮ |
|---|---|---|---|---|---|---|---|---|---|---|---|---|---|---|---|
| Character | @ | t | h | E | t | i | m | E | h | a | S | c | o | m | E |
| Code | 40 | 74 | 68 | 45 | 74 | 49 | 6d | 45 | 48 | 61 | 53 | 63 | 6f | 6d | 45 |

(15 characters)

FIG. 7

If you wish more details of PC-A4, please feel free to call me. (62 characters)

@IfYouWishMoreDetailsOf^PC-A4^,PleaseFeelFreeToCallMe. (54 characters)

FIG. 8A

| | ① | ② | ③ | ④ | ⑤ | ⑥ | ⑦ | ⑧ | ⑨ | ⑩ | ⑪ | ⑫ | ⑬ | ⑭ | ⑮ | ⑯ | ⑰ | ⑱ | |
|---|---|---|---|---|---|---|---|---|---|---|---|---|---|---|---|---|---|---|---|
| Character | @ | T | h | e | ␣ | t | i | m | e | ␣ | h | a | s | ␣ | c | o | m | e | (18 characters) |
| Code | 40 | 54 | 68 | 65 | 20 | 74 | 69 | 6d | 65 | 20 | 68 | 61 | 73 | 20 | 63 | 6f | 6d | 65 | |

FIG. 8B

| | ① | ② | ③ | ④ | ⑤ | ⑥ | ⑦ | ⑧ | ⑨ | ⑩ | ⑪ | ⑫ | ⑬ | ⑭ | ⑮ | |
|---|---|---|---|---|---|---|---|---|---|---|---|---|---|---|---|---|
| Character | @ | T | h | e | T | i | m | e | H | a | s | C | o | m | e | (15 characters) |
| Code | 40 | 54 | 68 | 65 | 54 | 49 | 6d | 65 | 48 | 61 | 73 | 43 | 6f | 6d | 65 | |

FIG. 8C

| | ① | ② | ③ | ④ | ⑤ | ⑥ | ⑦ | ⑧ | ⑨ | ⑩ | ⑪ | ⑫ | ⑬ | ⑭ | ⑮ | |
|---|---|---|---|---|---|---|---|---|---|---|---|---|---|---|---|---|
| Character | @ | t | h | E | t | i | m | E | h | a | S | c | o | m | E | (15 characters) |
| Code | 40 | 74 | 68 | 45 | 74 | 49 | 6d | 45 | 48 | 61 | 53 | 63 | 6f | 6d | 45 | |

INFORMATION PROCESSING APPARATUS

BACKGROUND OF THE INVENTION

1. Field of the Invention

The present invention relates to an information processing apparatus for processing character strings in control instructions (programs), for example, a workstation or a computer.

2. Description of the Related Art

A data communication apparatus generally includes a plurality of terminals (for example, workstations or computers) connected to each other by a communication unit. Users can transmit and/or receive data between the plurality of terminals.

An example of such an apparatus is shown in FIG. 1. The apparatus includes a data processing device 1 on the transmission end (transmission data processing device), a data processing device 2 on the receiving end (receiving data processing device), and a communication line 3 used for data communication between the data processing devices 1 and 2. When a transmission communication device, which is included in the data processing device 1, receives data from the data processing device 1, the transmission communication device converts the data into octet strings (8-bit strings) and transmits the octet strings to a receiving data communication device included in the data processing device 2 through the communication line 3.

Next, the octet strings are received, interpreted, and reproduced into the character strings in the original data format by the receiving communication device and are sent to the receiving data processing device 2.

Generally in the field of information communication, character strings including alphabetical characters and the like are represented by, for example, octet strings. Such a format is referred to as the "text format". Usually in the text format, one octet is required for one alphabetical character.

For data communication between a plurality of communication devices, the text format is often used. Character strings in the text format can be literally recognized by users with simple processing. For example, it is relatively easy to literally recognize the character strings in text format displayed on a display device and add new character strings thereto and/or delete a part of the character strings.

The text format can be used with relative ease with a low-priced electronic computing apparatus (for example, personal computer).

Due to these conveniences, the text format is widely applicable for uses in which the literal recognition level of data is relatively important, for example, in communications between two or more personal computers; and communication between data terminals and electronic computing apparatuses (host computers).

In order to reduce the amount of data to be transmitted and received between communication devices, data compression technologies such as the Huffmnan method and the LZ method are used. However, data which is compressed using such methods cannot be literally recognized, and requires significant processing cast (time, etc. ) to be decompressed. Thus, data compressed by these data compression technologies is not as convenient as the data in text format.

Japanese Laid-Open Patent Publication No. 5-189196 describes a method for compressing data in text format while maintaining the literal recognition level thereof. The publication specifically describes a compression system in which the vowels among the second and later characters of each word are all deleted. However, by this system, words such as "bat", "bet", "bit", "but", "bate", "beta", "bite", "beat", "beet", "boat" and "boot" are all compressed into "bt". An individual who is familiar with the language may determine which characters have been deleted based on the context of the compressed character string, but this may not be always possible. Accordingly, it is very difficult to accurately recognize the data compressed by these systems. Moreover, it is substantially impossible to accurately and routinely decompress the compressed data.

SUMMARY OF THE INVENTION

According to one aspect of the invention, an information processing apparatus includes a first input section for receiving a first string including a plurality of words and a border-indicating character indicating a border between two adjacent words in the first string; a first extraction section for extracting the plurality of words from the first string, based on the border-indicating character; a first conversion section for converting a leading character of each of the plurality of words into a different type of character; and a first output section for outputting a second string including the plurality of words with the converted leading characters substituted for the respective leading characters.

In one embodiment of the invention, the data processing apparatus further includes a second input section for receiving the second string output by the first output section; a second extraction section for extracting the converted leading characters and the plurality of words except for the converted leading characters from the second string, based on the converted leading characters; a second conversion section for converting the converted leading characters and the plurality of words except for the converted leading characters as extracted by the second extraction section into the plurality of words and inserting the border-indicating character between two adjacent words, based on the converted leading characters; and a second output section for outputting the plurality of words and the border-indicating character.

In another embodiment of the invention, the plurality of words each include at least one alphabetical character, and the border-indicating character is a blank character.

In still another embodiment of the invention, each of the leading characters of the words except for a leading word of the plurality of words is a lowercase letter, and each of the converted leading characters of the plurality of words except for the leading word is a capital letter.

In yet another embodiment of the invention, the leading character of the leading word of the plurality of words is a capital letter, and the converted leading character of the leading word is a lowercase letter.

According to another aspect of the invention, an information processing apparatus includes a first input section for receiving a first string including a plurality of words and a border-indicating character indicating a border between two adjacent words in the first string; a first extraction section for extracting the plurality of words from the first string, based on the border-indicating character; a first conversion section for converting a last character of each of the plurality of words into a different type of character; and a first output section for outputting a second string including the plurality of words with the converted last characters substituted for the respective last characters.

In one embodiment of the invention, the data processing apparatus further includes a second input section for receiving the second string output by the first output section; a second extraction section for extracting the converted last characters and the plurality of words except for the converted last characters from the second string, based on the converted last characters; a second conversion section for converting the converted last characters and the plurality of words except for the converted last characters as extracted by the second extraction section into the plurality of words and inserting the border-indicating character between two adjacent words, based on the converted last characters; and a second output section for outputting the plurality of words and the border-indicating character.

In another embodiment of the invention, the plurality of words each include at least one alphabetical character, and the border-indicating character is a blank character.

In still another embodiment of the invention, each of the last characters of the plurality of words is a lowercase letter, and each of the converted last characters of the plurality of words is a capital letter.

According to still another aspect of the invention, a data processing apparatus includes a first input section for receiving a first string including a plurality of words each having at least one character, a border-indicating character indicating a border between two adjacent words in the first string, and a first symbol indicating that a character subsequent to the first symbol is to remain unchanged; a first extraction section for extracting the plurality of words and the first symbol from the first string, based on the border-indicating character and the first symbol; a first conversion section for converting a leading character of each of the plurality of words except for the character subsequent to the first symbol into a different type of character; and a first output section for outputting a second string including the converted leading characters, the plurality of words except for the converted leading characters, and the first symbol.

In one embodiment of the invention, the information processing apparatus further includes a second input section for receiving the second string output by the first output section; a second extraction section for extracting the converted leading characters and the plurality of words except for the converted leading characters from the second string, and also extracting the first symbol, based on the converted leading characters and the first symbol; a second conversion section for converting the converted leading characters, the plurality of words except for the converted leading characters, and the character subsequent to the first symbol into the plurality of words and inserting the border-indicating character between two adjacent words, based on the converted leading characters and the first symbol; and a second output section for outputting the plurality of words, the border-indicating character, and the first symbol.

According to yet another aspect of the invention, an information processing apparatus includes a first input section for receiving a first string including a plurality of words each having at least one character, a border-indicating character indicating a border between two adjacent words in the first string, and two second symbols; a first extraction section for extracting the plurality of words and the two second symbols from the first string, based on the border-indicating character and the two second symbols; a first conversion section for converting a leading character of each of the plurality of words except for at least one word sandwiched by the two second symbols into a different type of character; and a first output section for outputting a second string including the converted leading characters, the plurality of words except for the converted leading characters, the at least one word sandwiched by the two second symbols, and the two symbols.

In one embodiment of the invention, the information processing apparatus further includes a second input section for receiving the second string output by the first output section; a second extraction section for extracting the converted leading characters and the plurality of words except for the converted leading characters from the second string, and also extracting the two second symbols, based on the converted leading characters and the two second symbols; a second conversion section for converting the converted leading characters, the plurality of words except for the converted leading character, and the at least one word sandwiched by the two second symbols into the plurality of words and inserting the border-indicating character between two adjacent words, based on the converted leading characters and the two second symbols; and a second output section for outputting the plurality of words, the border-indicating character, and the two second symbols.

Thus, the invention described herein makes possible the advantages of providing an information processing apparatus for carrying out a data compression method for compressing data with a relatively high compression ratio while maintaining a sufficient literal recognition level of the data.

These and other advantages of the present invention will become apparent to those skilled in the art upon reading and understanding the following detailed description with reference to the accompanying figures.

BRIEF DESCRIPTION OF THE DRAWINGS

FIG. 7 shows an exemplary character string compressed by the information processing apparatus according to the present invention; and FIG. 8A shows an exemplary character string obtained by the conventional information processing apparatus;

FIG. 8B shows an exemplary character string compressed by the information processing apparatus according to the present invention; and FIG. 8C shows another exemplary character string compressed by the information processing apparatus according to the present invention.

DESCRIPTION OF THE PREFERRED EMBODIMENTS

Hereinafter, the present invention will be described by way of illustrative, but non-limiting examples with reference to the accompanying drawings.

The character string in the following example is a program string. The program string includes alphabetical characters and blank characters which are inserted between two adjacent words.

Figure 1:
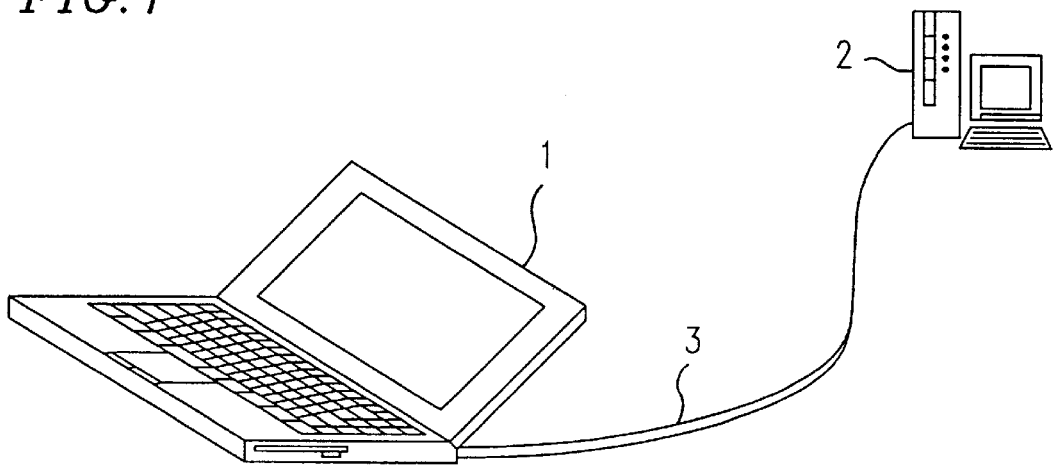
FIG. 1 shows a general structure of an information communication apparatus.

An information processing apparatus 10 according to an example of the present invention includes a data processing device 1 as shown in FIG. 1. As necessary, the information processing apparatus 10 can include a data processing device 2. The data processing devices 1 and 2 are, for example, personal computers and will be referred to as the personal computers 1 and 2 in the following description. In this example, the personal computer 1 is on the transmission end, and the personal computer 2 is on the receiving end. Alternatively, the personal computer 1 may be on the receiving end, and the personal computer 2 may be on the transmission end.

The personal computers 1 and 2 are connected to each other through a serial communication line 3 such as a RS-232C line, but alternatively can be connected through a telephone line.

In one exemplary operation of the data processing apparatus 10, the personal computer 1, which is executing a program communicates with another personal computer 2 and stores arbitrary data in the personal computer 2. At this point, the personal computer 2 may be executing a data base program. The data stored in the personal computer 2 can be used while the personal computer 2 is executing the data base program.

In this case, the personal computer 1 and 2 act as communication devices including a data compression device and/or a data decompression device. In the case where the personal computer 2 is on the transmission end and the personal computer 1 is on the receiving end, the personal computer 2 has a data compression function and the personal computer 1 has a data decompression function.

Figure 2:
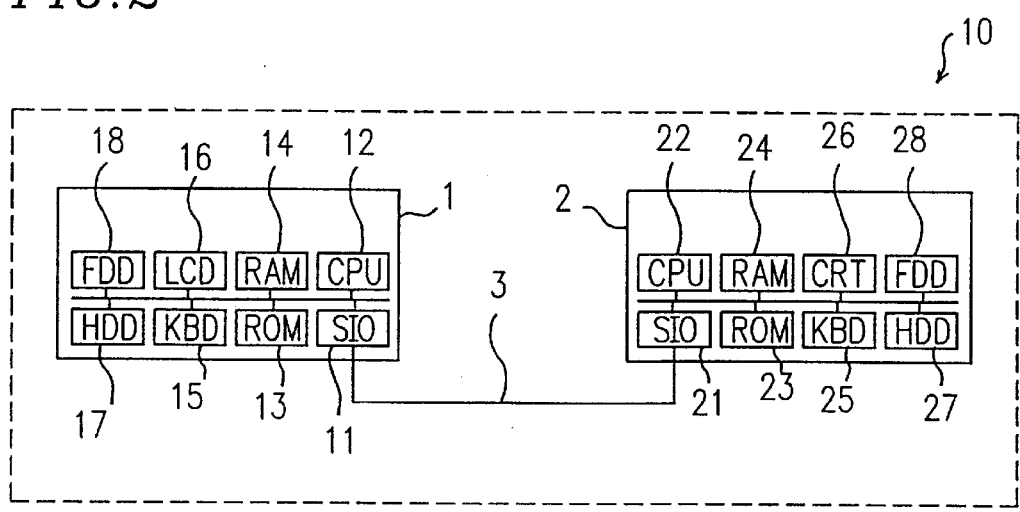
FIG. 2 shows an exemplary structure of information processing devices according to the present invention.

FIG. 2 shows an exemplary structure of personal computers 1 and 2.

The personal computer 1 acting as a communication device having a data compression function includes a serial/parallel converter (SIO) 11, a central processing unit (CPU) 12 for controlling the serial/parallel converter 11, a read only memory (ROM) 13, a random access memory (RAM) 14, an input/output device, and a memory device. The input/output device includes a keyboard (KBD) 15 and a display device (LCD) 16. The memory device includes a hard disk (HDD) 17 and a floppy disk device (FDD) 18. The personal computer 2 has substantially the same structure as that of the personal computer 1, namely, it includes a serial/parallel converter (SIO) 21, a central processing unit (CPU) 22 for controlling the serial/parallel converter 21, a read only memory (ROM) 23, a random access memory (RAM) 24, an input/output device, and a memory device. The input/output device includes a keyboard (KBD) 25 and a display device (CRT) 26. The memory device includes a hard disk (HDD) 27 and a floppy disk device (FDD) 28.

Personal computers can execute various programs such as an application program and a communications program. While executing the application program, the personal computer can perform registration, updating and inquiry of data at the request of the user. While executing the communications program, the personal computer can respond to another personal computer running the same or a different program as that being run by the personal computer executing the communication program, to communicate with other devices. The other devices include the personal computer running the same or different program.

In the information processing apparatus 10, a personal computer executing an application program on the transmission end starts data transmission by a command from the user. The data to be transmitted includes two types of data; i.e., data registration instructions to another personal computer which is executing the data base program, and data to be registered in the data base.

A personal computer which is executing the application program sends the data to be transmitted to a personal computer which is executing the communications program through the RAM 14. The personal computer which is executing the communications program receives the request from the personal computer executing the application program and starts operating. Thus, the personal computer starts operating as a communication device including a data compression device.

In the information processing apparatus 10, data communication is performed, for example, in the following manner. In this example, the personal computer 1 on the transmission end executes the application program, and the personal computer 2 on the receiving end executes the data base program.

The CPU 12 converts the data in the RAM 14 into octet strings in text format. A method for compressing the data will be described later. The octet strings obtained by the conversion are sent to the communication line 3 (e.g., RS-232C line) through the serial/parallel converter 11. The octet strings are then received by the personal computer 2 on the receiving end.

Figure 3:
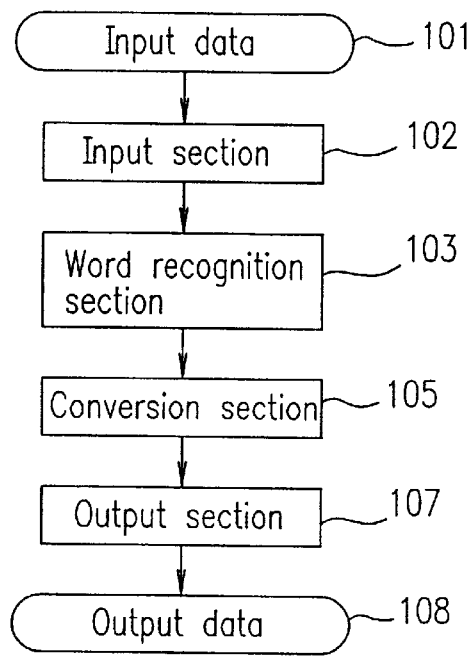
FIG. 3 shows an exemplary flow of data compression according to the present invention.

FIG. 3 shows an exemplary flow of the data compression portion of the present invention. The personal computer 1 on the transmission end executing the application program has input data 101 such as a communications program stored in the RAM 14. An input section 102 sends the input data 101 to a word recognition section 103 as character strings in text format. The input section 102 can also receive the input data 101 directly from the user. The data is compressed by the word recognition section 103 and a conversion section 105 by the method described below. An output section 107 outputs the data compressed by the word recognition section 103 and the conversion section 105 to the serial/parallel converter 11 as data in the octet format (octet strings).

The input data 101 includes, for example, a blank character and a word which includes at least one character. The input data 101 may include a control symbol. The input data 101 is also referred to as a "first string".

A "word" includes a term listed in dictionaries such as, for example, Webster's Third New International Dictionary and a command used for controlling the computer or the like.

A "blank character" refers to a character indicating the border between two adjacent words (also referred to as a "border-indicating character"). The "border" refers to the end of the first of two adjacent words and the beginning of the second of the two adjacent words. Accordingly, any character which indicates the end of the first of two adjacent words and the beginning of the second of the two adjacent words can be a border-indicating character. For example, the last character of the first of two adjacent words can be the border-indicating character, or the leading character of the second of the two adjacent words can be a border-indicating character.

In the case where the input data 101 includes a control symbol, the leading character of a word immediately subsequent to a control symbol is controlled by the control symbol as described below. A word or words sandwiched by another control symbols are controlled by the control symbols.

Compressed data includes at least one word having a literal recognition level. The expression "having a literal recognition level" refers to the state that the user can recognize that the word after compression is the same as the word before compression. This applied for both of the cases where the word is a term found in a dictionary as described above and where the word is a command used for the computer or the like.

The data compressed by the word recognition section 103 and the conversion section 105 and output by the output section 107 is referred to as a "second string".

The personal computer 2 on the receiving end acts as a communication device including a decompression device. A personal computer executing the communications program waits for the data base at the request of a personal computer executing the data base program.

In this example, the personal computer 2 operates in the following manner. The serial/parallel converter 21 receives the data from the communication line 3 and indicates that "data has been received". The personal computer executing the communications program which has been waiting detects the indication that the "data has been received" and starts operating. The data received by the serial/parallel converter 21, namely, the octet strings are decompressed by the personal computer executing the communications program.

The data transmitted by the personal computer executing the application program on the transmission end is sent to the CPU 22 executing the data base program through the RAM 24.

In the case where the personal computer executing the data base program interprets the received data as an instruction, the personal computer operates in the following manner. When a leading part of the data received is a data registration instruction, the personal computer extracts the data to be registered from the remaining part of the received data and registers the extracted data in the data base.

Figure 4:
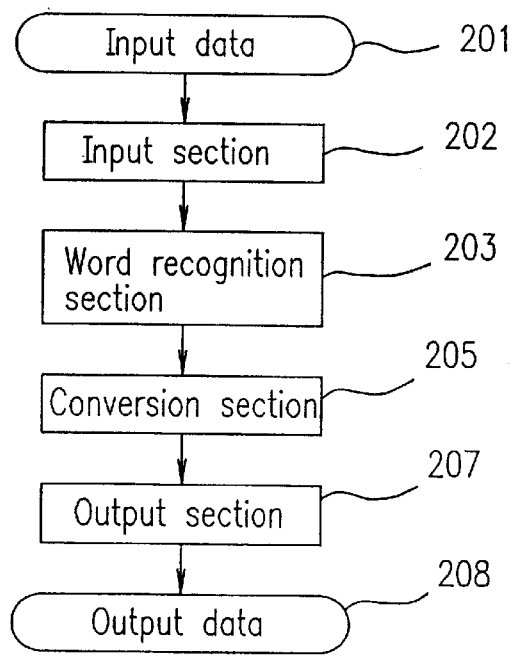
FIG. 4 shows an exemplary flow of data decompression according to the present invention.

FIG. 4 shows an exemplary flow of the data decompression portion of the present invention. Input data 201 is the data output from the serial/parallel converter 11 of the personal computer 1, namely, the octet strings. The input section 202 receives the input data 201 through the serial/parallel converter 21. The input section 202 sends the input data 201 to a word recognition section 203 as character strings. The data in the character strings is decompressed by the word recognition section 203 and the conversion section 205. The output section 207 outputs the decompressed data to the CPU 22 executing the data base program through the RAM 24.

The input data 201 received by the input section 202 includes a word having a literal recognition level as described above. The output section 207 can output the decompressed data, namely, the input data 101 to an external device.

Hereinafter, a data compression method according to the present invention will be described using the sentence "@The□time□has□come" as a sample sentence. In this specification, symbol "□" represents a blank character which indicates the border between two adjacent words. In this specification, the word which first appears in a sentence is referred to as the "leading word", and the character which first appears in a word is referred to as the "leading character". In this sample sentence, "The" is the leading word, and "T", "t", "h" and "c" are the leading characters. Also in this specification, a character which indicates a border between two adjacent words, such as a blank character, is referred to as a "border-indicating character".

Usually, one octet is required for one character. The exemplary sentence requires 18 characters including three octets for the three blank characters "□". Data compression is performed by deleting the blank characters. If the blank characters are simply deleted, the border between two adjacent words becomes unclear. In order to clearly show the border between two adjacent words, the leading character of each word is described with a different type of character from the original leading character.

Alternatively, the leading character of each word may be described with a different type of character from the characters following the leading character.

In an exemplary data compression, the leading character of each word is described with a capital letter except for the leading word, and the other characters are described with a lowercase letter. The leading character of the leading word is described with a lowercase letter. As a result, the sample sentence is described as "@TheTimeHasCome" as shown in FIG. 8B. The data is compressed by three octets.

In the case where it is desirable that the leading character of the leading word is a capital letter even after compression, the symbol "@" is inserted before such a character as shown in FIG. 7. With reference to FIG. 7, the character string "If you wish more details of PC-A4, please feel free to call me." is represented as: @IfYouWishMoreDetailsOfPC-A4, PleaseFeelFreeToCallMe. Symbol @ is used to indicate that the character immediately after it is output with no change.

Figure 5:
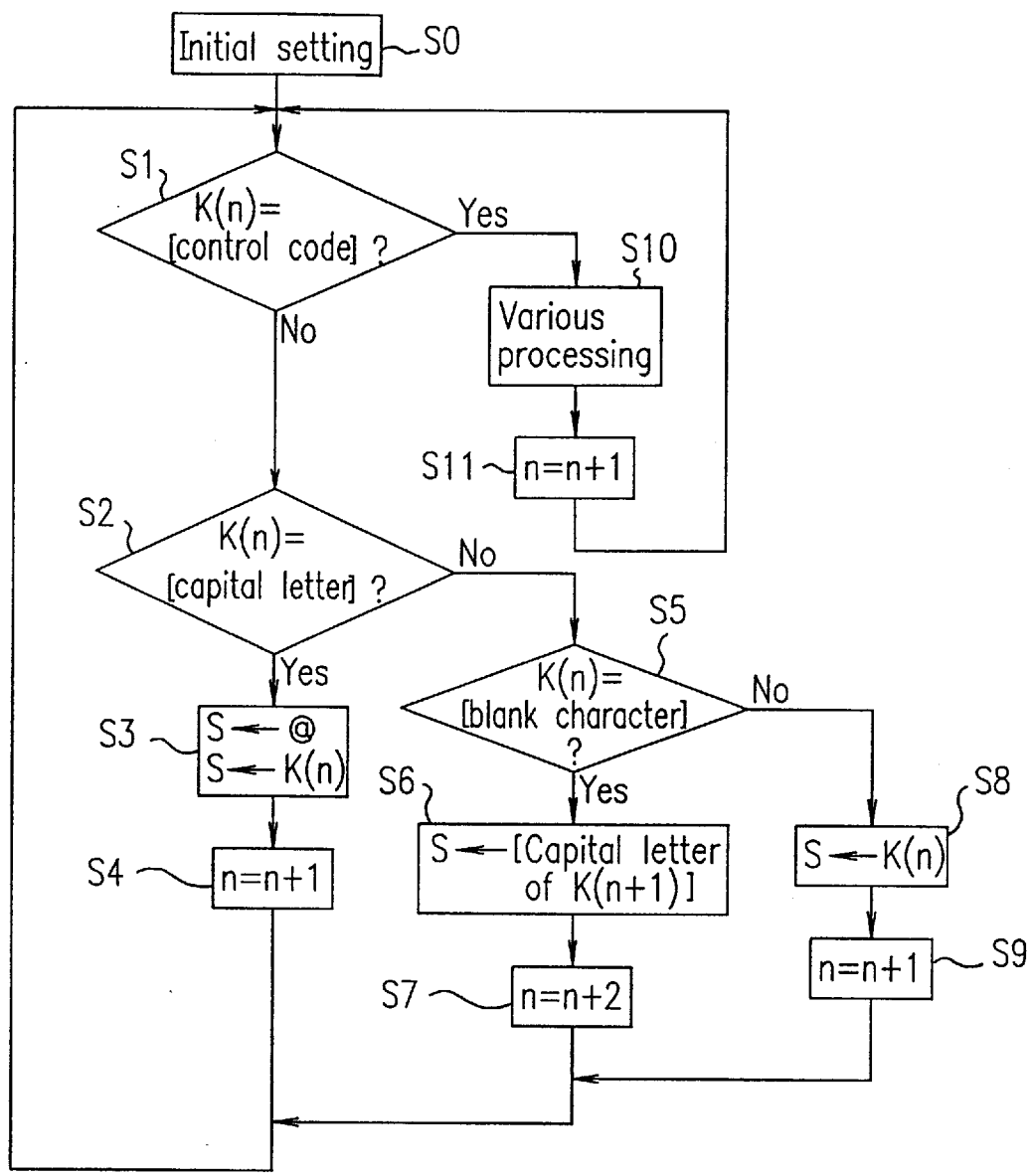
FIG. 5 is a flow chart showing an exemplary operation of the information processing apparatus according to the present invention for data compression.

Hereinafter, an exemplary method for data compression and decompression according to the present invention will be described with reference to FIG. 5. FIG. 5 is a flow chart showing an exemplary operation of the information processing apparatus 10 for data compression.

In step S0, the CPU 12 performs initial settings of various registers. Specifically, an input character string is stored in registers K(1) through K(j). K(1) indicates the leading character of the input character string, and K(2) indicates the character next to the leading character. Furthermore, register S for character strings to be output is initialized, and then "1" is stored in register n, which acts as a counter. The registers are provided in, for example, the RAM 14.

In step S1, the CPU 12 determines whether K(n) is a control code or not. If K(n) is determined to be a control code, the processing advances to step S10. If K(n) is determined not to be a control code, the processing advances to step S2.

In step S2, the CPU 12 determines whether K(n) is a capital letter or not. If K(n) is determined to be a capital letter, the processing advances to step S3. If K(n) is determined not to be a capital letter, the processing advances to step S5.

In step S5, the CPU 12 determines whether K(n) is a blank character or not. If K(n) is determined to be a blank character, the processing advances to step 56. If K(n) is determined not to be a blank character, the processing advances to step S8.

When the K(n) is determined to be a control code in step S1, the control code stored in K(n) is processed (for example, a new line is started) in step S10, and the value of n is counted up by one in step S11. Then, the processing returns to step S1.

When K(n) is determined to be a capital letter in step S2, symbol "@" and K(n) are input to register S in step S3. In step S4, the value of n is counted up by one. Then, the processing returns to step S1.

When K(n) is determined to be a blank character in step S5, the CPU 12 converts the next character X(n+1) into a capital letter of the same alphabetical character, which is input to register S in step S6. In step S7, the value of n is counted up by two. Then, the processing returns to step S1.

When K(n) is determined not to be a blank character, namely, when K(n) is determined not to be any of a control code, a capital letter, or a blank character, K(n) is input to register S as it is in step S8. In other words, from the input character string including a plurality of words and at least one blank character, the plurality of words are extracted. In step S9, the value of n is counted up by one. Then, the processing returns to step S1. By repeating such processing, the character string is compressed.

When the compression of a part or the entirety of the character string is not desired, the part or the entirety of the character string can be sandwiched by symbols "^". (See FIG. 7.)

Figure 6:
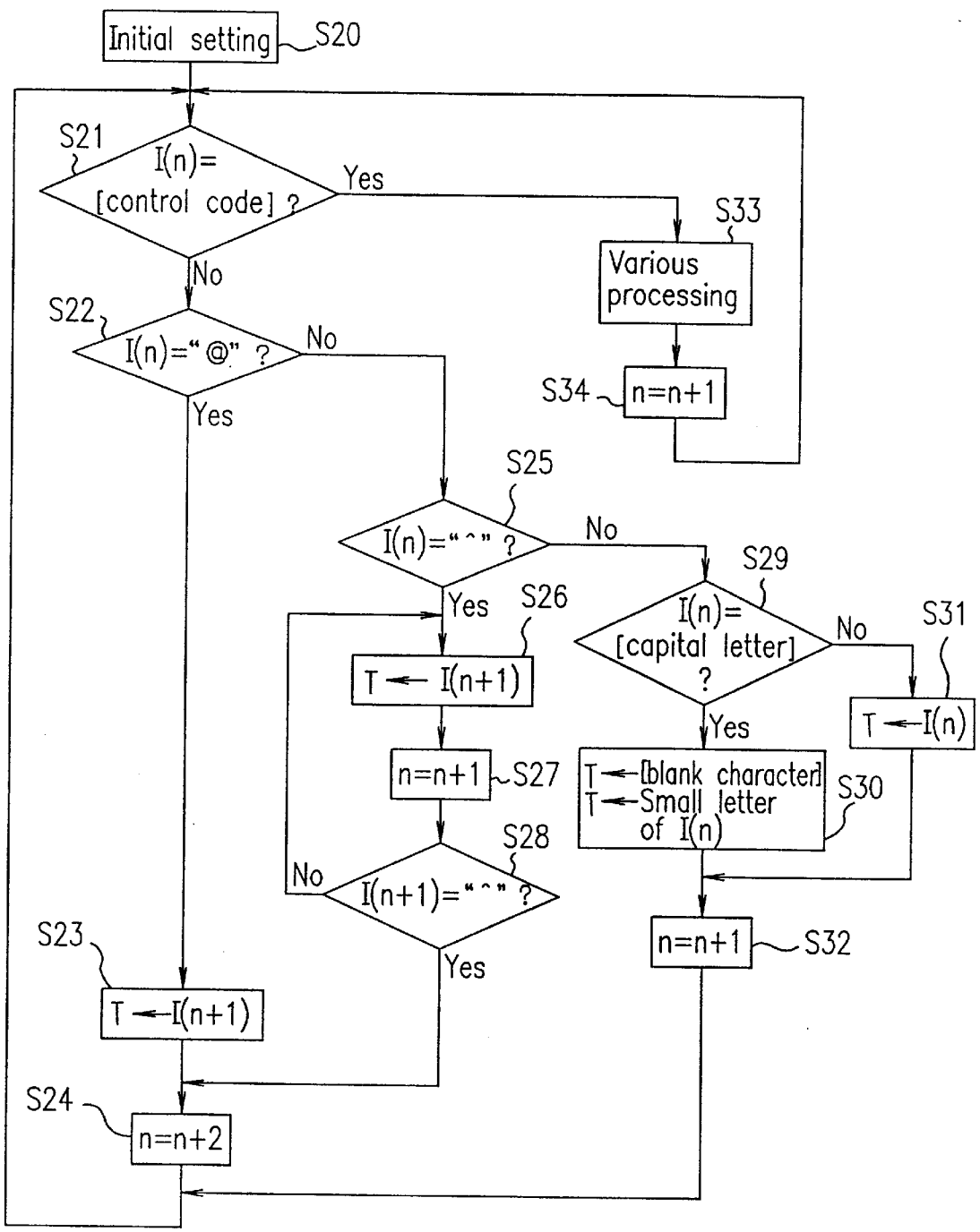
FIG. 6 is a flow chart showing an exemplary operation of the information processing apparatus according to the present invention for data decompression.

FIG. 6 is a flow chart showing an exemplary operation of the information processing apparatus 10 for data decompression.

In step S20, the CPU 22 performs initial settings of various registers. Specifically, an output character string is stored in registers I(1) through I(j). I(1) indicates the leading character of the output character string, and I(2) indicates the character next to the leading character. Furthermore, register T for character strings to be output is initialized, and "1" is stored in register n used as a counter. The registers are provided in, for example, the RAM 24.

In step S21, the CPU 22 determines whether I(n) is a control code or not. If I(n) is determined to be a control code, the processing advances to step S33. if I(n) is determined not to be a control code, the processing advances to step S22.

In step 822, the CPU 22 determines whether I(n) is "@" or not. If I(n) is determined to be "@", the processing advances to step S23. If I(n) is determined not to be "@", the processing advances to step S25.

In step S25, the CPU 22 determines whether I(n) is "^" or not. When I(n) is determined to be "^", the processing advances to step S26. When I(n) is determined not to be "^", the processing advances to step S29.

When I(n) is determined to be a control code in step S21, the control code stored in I(n) is processed (for example, a new line is started) in step S33, and the value of n is counted up by one in step S34. Then, the processing returns to step S21.

When I(n) is determined to be "@" in step S22, the next character I(n+1) is input to register T in step S23. In step S24, the value of n is counted up by two. Then, the processing returns to step S21.

When I(n) is determined to be "^" in step S25, the next character I(n+1) is input to register T in step S26. In step S27, the value of n is counted up by one. Then, the processing advances to step S28.

In step S28, the CPU 22 determines whether I(n+1) is "^" or not. If I(n+1) is determined to be "^", the processing goes to step S24. In step S24, the value of n is counted up by two. If I(n+1) is determined not to be "^", the processing returns to step S26, and then the processing in steps S26 and S27 is executed.

In step S29, the CPU 22 determines whether I(n) is a capital letter or not. If I(n) is determined to be a capital letter, the processing advances to step S30.

In step S30, a blank character is input to register T. Furthermore, I(n) is converted into a lowercase letter of the same alphabetical character and input to register T.

If I(n) is determined not to be a capital letter in step S29, namely, when I(n) is determined not to be any of the symbol "@", the symbol "^", or a capital letter, the processing advances to step S31. In step S31, I(n) is input to register T, and the processing advances to step S32. In step S32, the value of n is counted up by one, and the processing returns to step S21. By repeating such processing, the character string is decompressed.

In this example, the leading character of each word is converted into a capital letter of the same alphabetical character in order to clearly show the border between two adjacent words. Alternatively, as shown in FIG. 8C, the last character of each word may be converted into a capital letter. In this case, the leading character of each word is not converted.

Due to the data compression method executed by an information processing apparatus according to the present invention, a character string including a plurality of words clearly separated from each other by a space or the like is compressed. In the data obtained by the compression, the border between every two adjacent words is indicated by at least a leading character or a last character of each word being assigned a different type of character which has the same meaning as but a different appearance from those of the original character. The different type of character is, for example, a capital letter or a lowercase letter of the same alphabetical character. Such a data compression method is useful in compressing character strings in languages such as, for example, English, German and French.

A data processing device at the receiving end sometimes divides the data in the text format into word strings (referred to as "tokens") prior to interpretation of the data transmitted through the communication line.

According to a widely used rule for representing or interpreting data in the text format including word strings having an infinite length, blank characters are used in order to indicate a border between two adjacent words. Data in the text format is generated by inserting blank characters between two adjacent words. When the receiving data processing device finds a blank character while interpreting data in the text format, the device acknowledges that the word before the blank character and the word after the blank character are not included in a single word.

FIG. 8A shows a representation of data including four words "@The", "time", "has" and "come" in conformity with the word representation rule using blank characters. In this case, the total number of characters forming the four words is 4+4+3+4=15. Since three blank characters are necessary in addition to the 15 characters, 18 characters are necessary in total. In this example, the character strings are represented by the ASCII code; namely, one octet is used for one character. Accordingly, 18 octets are necessary to represent the character strings shown in FIG. 8A.

In the representation rule using blank characters, the number of blank characters is one less than the number of words present. Such a system increases the data amount. Such an increased data amount reduces the amount of effective data which can be communicated per unit time between the plurality of communication devices through the communication line. The resultant increase in the required communication time raises the communication cost.

As described above, by an information processing apparatus for carrying out the above-described data compression method, data is compressed by deleting spaces between adjacent two words. Thus, the data can be compressed with a relatively high compression ratio while the sufficient literal recognition level of the data is maintained.

Data compression according to the present invention can also be used for compressing a program list and the like described using alphabetical characters. Since different commands, etc. are separated by blank or the like, and the number of characters of each command is relatively small, a relatively high compression ratio can be expected.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An information processing apparatus, comprising:
   a first input section for receiving a first string including a plurality of words and a border-indicating character indicating a border between two adjacent words in the first string;
   a first extraction section for extracting the plurality of words from the first string, based on the border-indicating character;
   a first conversion section for converting a leading character of each of the plurality of words into a different type of character; and
   a first output section for outputting a second string including the plurality of words with the converted leading characters substituted for the respective leading characters.

2. An information processing apparatus according to claim 1, further comprising:
   a second input section for receiving the second string output by the first output section;
   a second extraction section for extracting the converted leading characters and the plurality of words except for the converted leading characters from the second string, based on the converted leading characters;
   a second conversion section for converting the converted leading characters and the plurality of words except for the converted leading characters as extracted by the second extraction section into the plurality of words and inserting the border-indicating character between two adjacent words, based on the converted leading characters; and
   a second output section for outputting the plurality of words and the border-indicating character.

3. An information processing apparatus according to claim 1, wherein the plurality of words each include at least one alphabetical character, and the border-indicating character is a blank character.

4. An information processing apparatus according to claim 1, wherein each of the leading characters of the words except for a leading word of the plurality of words is a lowercase letter, and each of the converted leading characters of the plurality of words except for the leading word is a capital letter.

5. An information processing apparatus according to claim 4, wherein the leading character of the leading word of the plurality of words is a capital letter, and the converted leading character of the leading word is a lowercase letter.

6. An information processing apparatus, comprising:
   a first input section for receiving a first string including a plurality of words and a border-indicating character indicating a border between two adjacent words in the first string;
   a first extraction section for extracting the plurality of words from the first string, based on the border-indicating character;
   a first conversion section for converting a last character of each of the plurality of words into a different type of character; and
   a first output section for outputting a second string including the plurality of words with the converted last characters substituted for the respective last characters.

7. An information processing apparatus according to claim 6, further comprising:
   a second input section for receiving the second string output by the first output section;
   a second extraction section for extracting the converted last characters and the plurality of words except for the converted last characters from the second string, based on the converted last characters;
   a second conversion section for converting the converted last characters and the plurality of words except for the converted last characters as extracted by the second extraction section into the plurality of words and inserting the border-indicating character between two adjacent words, based on the converted last characters; and
   a second output section for outputting the plurality of words and the border-indicating character.

8. An information processing apparatus according to claim 6, wherein the plurality of words each include at least one alphabetical character, and the border-indicating character is a blank character.

9. An information processing apparatus according to claim 6, wherein each of the last characters of the plurality of words is a lowercase letter, and each of the converted last characters of the plurality of words is a capital letter.

10. An information processing apparatus, comprising:
    a first input section for receiving a first string including a plurality of words each having at least one character, a border-indicating character indicating a border between two adjacent words in the first string, and a first symbol indicating that a character subsequent to the first symbol is to remain unchanged;
    a first extraction section for extracting the plurality of words and the first symbol from the first string, based on the border-indicating character and the first symbol;
    a first conversion section for converting a leading character of each of the plurality of words except for the character subsequent to the first symbol into a different type of character; and
    a first output section for outputting a second string including the converted leading characters, the plurality of words except for the converted leading characters, and the first symbol.

11. An information processing apparatus according to claim 10, further comprising:
    a second input section for receiving the second string output by the first output section;
    a second extraction section for extracting the converted leading characters and the plurality of words except for the converted leading characters from the second string, and also extracting the first symbol, based on the converted leading characters and the first symbol;
    a second conversion section for converting the converted leading characters, the plurality of words except for the converted leading characters, and the character subsequent to the first symbol into the plurality of words and inserting the border-indicating character between two adjacent words, based on the converted leading characters and the first symbol; and
    a second output section for outputting the plurality of words, the border-indicating character, and the first symbol.

12. An information processing apparatus, comprising:
    a first input section for receiving a first string including a plurality of words each having at least one character, a border-indicating character indicating a border between two adjacent words in the first string, and two second symbols;

a first extraction section for extracting the plurality of words and the two second symbols from the first string, based on the border-indicating character and the two second symbols;

a first conversion section for converting a leading character of each of the plurality of words except for at least one word sandwiched by the two second symbols into a different type of character; and a first output section for outputting a second string including the converted leading characters, the plurality of words except for the converted leading characters, the at least one word sandwiched by the two second symbols, and the two symbols.

13. An information processing apparatus according to claim 12, further comprising:

a second input section for receiving the second string output by the first output section;

a second extraction section for extracting the converted leading characters and the plurality of words except for the converted leading characters from the second string, and also extracting the two second symbols, based on the converted leading characters and the two second symbols;

a second conversion section for converting the converted leading characters, the plurality of words except for the converted leading character, and the at least one word sandwiched by the two second symbols into the plurality of words and inserting the border-indicating character between two adjacent words, based on the converted leading characters and the two second symbols; and a second output section for outputting the plurality of words, the border-indicating character, and the two second symbols.

* * * * *